United States Patent
Kaneko

[11] Patent Number: 5,530,955
[45] Date of Patent: Jun. 25, 1996

[54] PAGE MEMORY DEVICE CAPABLE OF SHORT CYCLE ACCESS OF DIFFERENT PAGES BY A PLURALITY OF DATA PROCESSORS

[75] Inventor: Katsuyuki Kaneko, Osaka, Japan

[73] Assignee: Matsushita Electric Industrial Co., Ltd., Osaka, Japan

[21] Appl. No.: 308,527

[22] Filed: Sep. 19, 1994

Related U.S. Application Data

[63] Continuation of Ser. No. 861,588, Apr. 1, 1992, abandoned.

[30] Foreign Application Priority Data

Apr. 1, 1991 [JP] Japan .................................. 3-068376

[51] Int. Cl.$^6$ .............................. G06F 12/00; G06F 13/16; G11C 7/00; G11C 8/00
[52] U.S. Cl. ...................... 395/431; 395/474; 395/432; 364/DIG. 1; 364/228.1; 364/249; 364/254.3; 365/189.05; 365/230.02; 365/238.5
[58] Field of Search ................... 395/425, 431, 395/432, 429, 430; 365/189.02, 189.05, 205, 230.08, 230.03, 238.5, 193

[56] References Cited

U.S. PATENT DOCUMENTS

| | | | |
|---|---|---|---|
| 4,829,471 | 5/1989 | Banerjee et al. | 395/250 |
| 4,939,636 | 7/1990 | Nakagawa et al. | 395/425 |
| 5,088,062 | 2/1992 | Shikata | 365/189.05 |
| 5,111,386 | 5/1992 | Fujishima et al. | 395/425 |
| 5,278,790 | 1/1994 | Kanabara | 365/189.05 |
| 5,283,880 | 2/1994 | Marcias-Gorza | 395/425 |
| 5,293,347 | 3/1994 | Ogawa | 365/230.01 |

*Primary Examiner*—Eddie P. Chan
*Assistant Examiner*—Reginald G. Bragdon
*Attorney, Agent, or Firm*—Willian Brinks Hofer Gilson & Lione

[57] ABSTRACT

A plurality of data latch circuits each used to store row data for one page from a memory cell array are provided, each data latch circuit being allotted to a data processor. An address is given in a multiplexed manner of a row address RA and a column address CA. Data in each data latch circuit is updated when the row address RA is given while the data latch circuit is selected.

7 Claims, 8 Drawing Sheets

PAGE MEMORY DEVICE CAPABLE OF SHORT CYCLE ACCESS OF DIFFERENT PAGES BY A PLURALITY OF DATA PROCESSORS

This application is a continuation of application Ser. No. 07/861,588 filed Apr. 1, 1992, now abandoned.

BACKGROUND OF THE INVENTION

This invention relates to a page mode operating memory device, and further to a data processing system having a configuration so that a plurality of data processors access a common memory device.

FIG. 8 shows a large scale-integrated DRAM (dynamic RAM) configuration, as an example of conventional semiconductor memory devices.

As shown, this LSI includes N address input terminals A, M data input/output terminals D, and four control input terminals C. A row address RA and a column address CA are externally applied to the address input terminals A via a set of address lines, in a multiplexed manner. For example, a 1M×1 organization DRAM of 1-megabit memory capacity has ten address input terminals A and a single data input/output terminal D. For a 20-bit address, the upper 10-bits are a row address RA and lower 10-bits are a column address CA. The row address RA and column address CA are externally applied to the ten input terminals A, respectively. On the other hand, a 1M×4 organization DRAM having 1-megabit memory capacity and dealing with 4-bits of data has nine address input terminals A and four data input/output terminals D. The four control input terminals C are input terminals for a row address strobe (RAS) signal, a column address strobe (CAS) signal, a write enable (WE) signal, and an output enable (OE) signal, respectively. Among the above signals that are input at the control input terminals C, the RAS signal indicates latch timing of the row address RA, and the CAS signal indicates latch timing of the column address CA. The WE signal is used to switch operations from a read operation to a write operation, and vice versa.

An internal configuration of the aforesaid memory device will be described. Reference numeral 1 represents a memory cell array which includes a plurality of unit memory cells arranged at respective points of intersection of rows and columns. Reference numeral 2 represents a row address buffer which holds a row address RA received through the address input terminals A. Reference numeral 3 represents a row decoder that decodes an output of the row address buffer 2 to select a row of data from memory cell array 1. Reference numeral 4 represents a sense and latch circuit, which reads and stores data of all columns which belong to a row selected from the memory cell array 1 by the row decoder 3, as row data for one page while at the same time amplifying them by sense amplifiers. The sense and latch circuit 4 also writes data to a row selected. Reference numeral 5 denotes a column decoder for selecting an item of data corresponding to one column designated from among the row data for one page stored in the sense and latch circuit 4. Reference numeral 6 denotes a column address buffer to store a column address CA received through the address input terminals A, and to transfer the column address CA to the column decoder 5. Reference numeral 7 represents a data input/output circuit for amplifying an item of data, selected by the column decoder 5, from the sense and latch circuit 4 under control of WE and OE signals. Data input/output circuit 7 outputs the amplified data to the data input/output terminals D as reading data or feeds data to be written to memory cell array 1 received through the data input/output terminals D, to the sense and latch circuit 4. Reference numeral 8 denotes a clock generator to generate from RAS, CAS, and WE signals various timing signals necessary for reading and writing operations to drive the row address buffer 2, the row decoder 3, the sense and latch circuit 4, the column decoder 5, and the column address buffer 6, respectively.

In accordance with the memory device, as shown in FIG. 8, having the foregoing configuration, if a RAS signal is received, an address on the address input terminals A is latched in the row address buffer 2, as a row address RA, then row data for one page selected by the row decoder 3 from the memory cell array 1 is read, and the row data thus read is latched in the sense and latch circuit 4. This operation is known as RAS access. In the case that a CAS signal is successively received, the address on the address input terminals A is latched in the column address buffer 6, as a column address CA, and an item of data, selected by the column decoder 5 from among the row data for one page that is latched in the sense and latch circuit 4, is read, then the data thus read is output through the data input/output circuit 7. This is known as CAS access.

Since the sense and latch circuit 4 always stores an entire row of data for one page, if subsequent row addresses RA are the same, that data may be read using only the CAS access where a row address RA is not received. In other words, when the range of address exceeds one page, a long cycle operation which gives both a row address RA and a column address CA individually is required. However, within the range of address for one page where the row address RA remains unchanged, data may be read continuously at high speed by a short cycle operation using a column address only. Practically, a CPU as a central data processor and a peripheral data processor (for example, a DMA controller) usually continue to access the same page, respectively. Further, Intel Corporation's DRAM Controller 82C08 is one of the known memory controllers for feeding to a memory device a row address RA and a column address CA, in a multiplexed manner.

As explained above, a conventional memory device has been configured so that it only holds row data for one page from the memory cell array 1, in the sense and latch circuit 4. Because of this configuration, if two data processors, for example, alternately access different pages in the memory device, a long cycle operation giving a row address RA and a column address CA is required for every memory access. As the frequency of long cycle operations becomes higher, the advantage of the page mode operation, or quick access may not be achieved. In other words, the average access time becomes longer, and the processing efficiency of a data processing system that employs a memory device of this type drops. In addition, the frequency of operation of the sense amplifiers in the sense and latch circuit 4 increases, which leads to the increase of power consumption in the memory device.

It is therefore an object of the present invention to provide a memory device capable of carrying out a short cycle operation even if different pages are alternately accessed by a plurality of data processors. It is another object of the invention to improve the process efficiency of a data processing system with a configuration in which plurality of data processors access a common memory device.

SUMMARY OF THE INVENTION

With a view to accomplishing the above objects, the present invention is a memory device comprising a memory cell array having a plurality of unit memory cells arranged at respective points of intersection of rows and columns, the memory device receives externally applied row and column addresses in a multiplexed manner designating a row and a column of the memory cell array. The memory device includes a plurality of data latch circuits that individually store row data for one page from the memory cell array, and the data latch circuits are allotted to respective data processors.

More specifically, in addition to the above memory cell array, the invention employs a configuration for a memory device including row data reading means, a plurality of data latch circuits, and control means. The row data reading means is a means for simultaneously reading, as row data for one page, data of all columns that belong to a single row designated from the memory cell array by a row address. Each data latch circuit stores the row data for one page that is read from the memory cell array. The control means is a means to have the row data for one page, read from the memory cell array by means of the row data reading means, stored in a data latch circuit that is designated by a latch selection signal, if a request for reading data contains a row address. If the memory device receives a request for reading data containing a column address, the control means selectively reads data, which corresponds to a single column that is designated by the column address, from among the row data for one page that is stored in the data latch circuit designated by the latch selection signal, and inputs the read data.

According to this configuration, the memory device may be accessed not only by a multiplexed address (i.e., row and column addresses) but also by a latch selection signal. Advantageously, if a row address and then a column address are given to a memory device with one data latch circuit (i.e., a first data latch circuit) designated by a latch selection signal, and with a request for reading data, an item of data is read by a long cycle operation. At this time, row data for one page is stored in the first data latch circuit. This row data for one page stored in the first data latch circuit is not modified even if a long cycle operation is executed using another data latch circuit (a second data latch circuit). Accordingly, a short cycle operation eliminating the need for providing a row address is possible when designating the first data latch circuit next time. Therefore, with the present memory device, if different pages are alternately accessed by a plurality of data processors, a short cycle operation is feasible. Thus, the frequency of long cycle operations is lower. As a result, the average access time with respect to the memory device is shortened, and its power consumption is reduced.

It is preferable to further include a plurality of flip-flop circuits corresponding to the data latch circuits, respectively, in order to individually store 1-bit of information as a flag. It is also preferable to additionally provide the control means with the following functions. The control means resets the flag of a flip-flop circuit that corresponds to a data latch circuit designated by a latch selection signal if a row address is given with a request for reading data, sets all flags of the flip-flop circuits if the writing of data is requested, and produces at an output terminal a signal indicative of the flag of a flip-flop circuit that corresponds to a data latch circuit designated by a latch selection signal if a column address is given with a request for reading data.

According to the above configuration, in the event that row data for one page read from the memory cell array is transferred to a data latch circuit (a first data latch circuit), a flag of a flip-flop circuit corresponding to the first data latch circuit is reset. In other words, the reset state of the flag indicates a correspondence between the row data of the first data latch circuit and the corresponding data in the memory cell array. If a short cycle operation using the first data latch circuit is carried out, only the flag reset is read. However, if a write request is received, there might be a data mismatch between the memory cell array and all data latch circuits resulting from the rewriting of data in the memory cell array. Thus, a flag, which is output selectively from the flip-flop circuits when a column address is given with a request for reading data, tells the availability of row data for one page held in each data latch circuit. Thus, the flag shows the suitability of a short cycle operation.

Another memory device in accordance with the invention employs a configuration comprising, other than the aforesaid memory cell array, a row address buffer, a row decoder, a sense and latch circuit, a plurality of data latch circuits, a column address buffer, a column decoder, and a clock generator. The row address buffer stores an externally applied row address. The row decoder selects from the rows of the memory cell array a single row that is designated by the row address stored by the row address buffer. The sense and latch circuit is a circuit for simultaneously reading data of all columns belonging to a row selected from the memory cell array by the row decoder, as row data for one page, and for storing the row data for one page thus read. The row address buffer, row decoder, and sense and latch circuit correspond to the aforesaid row data reading means. Each of the data latch circuits stores row data for one page read from the memory cell array by means of the sense and latch circuit. The column address buffer stores an externally applied column address. From the row data for one page stored in the sense and latch circuit and in the data latch circuits respectively, the column decoder selects an item of data that corresponds to a single column designated by the column adess stored in the column address buffer. Further, the clock generator receives a latch selection signal used to selectively designate any one of the sense and latch circuit and the data latch circuits; a write enable signal used to selectively request the reading of data from the memory cell array and the writing of data to the memory cell array by way of the sense and latch circuit; a row address strobe signal given together with a row address; and a column address strobe signal given together with a column address, respectively. Also, the clock generator drives the row address buffer, the row decoder, the sense and latch circuit, the data latch circuits, the column address buffer, and the column decoder, respectively.

If the clock generator receives a row address strobe signal with any one of the data latch circuits designated by a latch selection signal, and with a request for reading data by a write enable signal, it individually drives the row address buffer, the row decoder, the sense and latch circuit, and the data latch circuit designated in order that the row data for one page, read from the memory cell array according to the row address, is stored in the sense and latch circuit and the designated data latch circuit. Similarly, if the clock generator receives a column address strobe signal with any one of the data latch circuits designated by a latch selection signal, and with a request for reading data by a write enable signal, it individually drives the designated data latch circuit, the column address buffer, and the column decoder so that an item of data, selected from the row data for one page stored in the designated data latch circuit according to the column address, is output. The column address buffer, the column decoder, and the clock generator correspond to the aforesaid control means.

According to this configuration, the memory device may be accessed not only by a multiplexed address (i.e., row and column addresses) but also by a latch selection signal. If the memory device receives a row address, a RAS, a column address, a CAS, a latch selection signal designating a data latch circuit, and a WE signal requesting reading of data, the memory is read by a long cycle operation using the sense and latch circuit. This operation causes data for one page to be stored in the first data latch circuit. The row data for one page stored in the first data latch circuit is not modified even if a long cycle operation is executed using another data latch circuit (a second data latch circuit). Accordingly, a short cycle operation omitting the row address is possible when designating the first data latch circuit next time. Therefore, with the present memory device, if different pages are alternately accessed by a plurality of data processors, a short cycle operation is feasible. This means that the frequency of long cycle operations is reduced. As a result, the average access time with respect to the memory device is shortened, and its power consumption is reduced.

It is preferable to further include a plurality of flip-flop circuits corresponding to the data latch circuits respectively in order to individually store 1-bit of information as a flag. It is also preferable to further provide the clock generator with the following functions. If the clock generator receives a row address strobe signal with a latch selection signal designating one of the data latch circuits, and with a request for reading data by a write enable signal, it resets the flag of the flip-flop circuit corresponding to the designated data latch circuit. In addition, the clock generator sets the flags of all the flip-flop circuits if it receives a write enable signal which requests the writing of data. Further, if the clock generator receives a column address strobe signal with a latch signal designating one of the data latch circuits, and with a request for reading data by a write enable signal, it produces at an output terminal a signal indicative of the flag of the flip-flop circuit corresponding to the designated data latch circuit. According to this configuration, a flag selectively produced from the flip-flop circuits indicates the availability of row data for one page stored in each data latch circuit. That is, the flag shows the suitability of a short cycle operation.

A data processing system of the invention employs a configuration including a plurality of data processors which jointly share a set of data lines, a memory device for outputting data to the data lines, and a plurality of memory controllers arranged in a corresponding relationship with the data processors, respectively. Together with the memory device, the memory controllers jointly share a set of address lines, and feed to the memory device row and column addresses based on addresses fed from respective corresponding data processors, in a multiplexed manner through the address lines. Each of the memory controllers stores the last row address received by the memory device, as a latest address; produces the aforesaid latch selection signal to designate a corresponding data latch circuit within the memory device; selects a long cycle operation to feed a row address and then a column address to the memory device while at the same time requesting the memory device to read data if a next row address to be fed to the memory device is different from the aforesaid latest address; and selects a short cycle operation to continuously feed column addresses to the memory device while at the same time requesting the memory device to read data if a next row address to be fed to the memory device corresponds to the latest address.

With this configuration, if a data processor (i.e., a first data processor) feeds an address to a corresponding memory controller (i.e., a first memory controller), the first memory controller selects either a long cycle operation or a short cycle operation referring to its own access history to the memory device. If the first memory controller selects a long cycle reading operation, row data for one page is transferred from the memory cell array to a data latch circuit (i.e., a first data latch circuit) allotted to the first data processor in the memory device, and then an item of data is read from the row data. The row data for one page in the first data latch circuit is not modified even if another memory controller (i.e., a second memory controller), which corresponds to another data processor (i.e., a second data processor), selects a long cycle operation using another data latch circuit (i.e., a second data latch circuit) in the memory device. Accordingly, when the first data processor accesses to the memory device next time, the first memory controller may select a short cycle operation omitting the row address. In other words, even if a plurality of data processors alternately access different pages in the memory device, the memory controllers corresponding to respective data processors can select a short cycle reading operation referring to their own memory device access history. As a result, the frequency of long cycle operation of the memory device becomes relatively low, the memory access becomes faster, and the process efficiency of the data processing system can be improved.

Another data processing system in accordance with the invention ,employs a configuration including a plurality of data processors,, the memory device of the invention having the aforesaid plural flip-flop circuits, and a plurality of memory controllers. Further, the memory device has the data latch circuits and the flip-flop circuits arranged in a corresponding relationship with the respective data processors. Each of the memory controllers stores the last row address received by the memory device as a latest address; designates a corresponding data latch circuit and flip-flop circuit in the memory device by producing the aforesaid latch selection signal; and selects a long cycle operation to feed to the memory device a row address and then a column address while at the same time requesting that the memory device read data if a flag selectively output from the flip-flop circuit designated in the memory device is set, or if the next row address to be fed to the memory device is different from the latest address. Further, each of the memory controllers selects a short cycle operation to continuously feed to the memory device column addresses while at the same time requesting the memory device read data if a flag, selectively output from the flip-flop circuit designated in the memory device, is reset, and the next row address to be fed to the memory device corresponds to the latest address.

With this configuration, each memory controller selects a long cycle or a short cycle reading operation or, vice versa according to its memory device access history and the flag of its corresponding flip-flop circuit. If the flag indicates the possibility of inconsistency of data (that is, the flag is set), reading of inaccurate data by a short cycle operation is avoided by selecting a long cycle operation, even if a next row address to be given to the memory device corresponds to the last row address (a latest address) received by the memory device. Accordingly, even if a plurality of data processors alternately access different pages in the memory device, it is not only possible to select a short cycle reading operation, but the invention also avoids reading of inaccurate data using a short cycle operation. Therefore, the process efficiency of a data processing system together with its reliability is improved.

Still another data processing system of the invention employs a configuration including a plurality of data processor jointly sharing a set of data lines; a memory device which has a plurality of unit memory cells disposed at respective points of intersection of rows and columns, and to which data of all columns belonging to a single row designated by a row address is simultaneously read as row data for one page; a plurality of data latches to the respective data processors; and a plurality of memory controllers corresponding to the respective data processors. In addition, the data latches jointly share the data lines together with the data processors, individually store row data for one page read from the memory device, and selectively output to the data lines an item of data corresponding to a single column designated by a column address, from among the row data individually stored. The memory controllers share a set of address lines together with the memory device and the data latches, and individually feed row and column addresses, based on an address fed from a corresponding data processor of the plural data processors, to the memory device and the data latches. Each of the memory controllers stores the last row address received by the memory device as a latest address, designates a corresponding data latches circuit, and selects, if the next row address to be fed to the memory device is different from the latest address, a long cycle operation to feed a column address to the designated data latch after giving a row address to the memory device in order that an item of data stored in the memory device is selectively output to the data lines via the designated data latch. Further, each of the memory controllers selects, if the next row address to be fed to the memory device corresponds to the latest address, a short cycle operation to continuously feed column addresses to the designated data latch in order that an item of data is selectively output from among the row data for one page stored in the previously designated data latch to the data lines.

With this configuration, if one data processor (a first data processor) feeds an address to its corresponding memory controller (a first memory controller), the first memory controller selects either a long cycle operation or a short cycle operation referring to its own access history with respect to the memory device. If the first memory controller selects a long cycle reading operation, row data for one page is transferred from the memory device to a data latch (a first data latch) allotted to the first data processor, and then an item of data is read from the row data. The row data for one page in the first data latch is not modified even if another memory controller (a second memory controller) corresponding to another data processor (a second data processor) selects a long cycle operation using another data latch (a second data latch). Accordingly, when the first data processor accesses the memory device next time, the first memory controller may select a short cycle operation omitting a row address. Therefore, even if a plurality of data processors alternately access different pages in the memory device, each corresponding memory controller may select a short cycle reading operation according to its own access history to the memory device. Thus, the frequency of long cycle operations, including the reading of row data from the memory device becomes lower, the memory access is faster, and the performance of the data processing system is improved.

DESCRIPTION OF THE INVENTION

Embodiments of the invention will be described with reference to the accompanying drawings.

Figure 1:
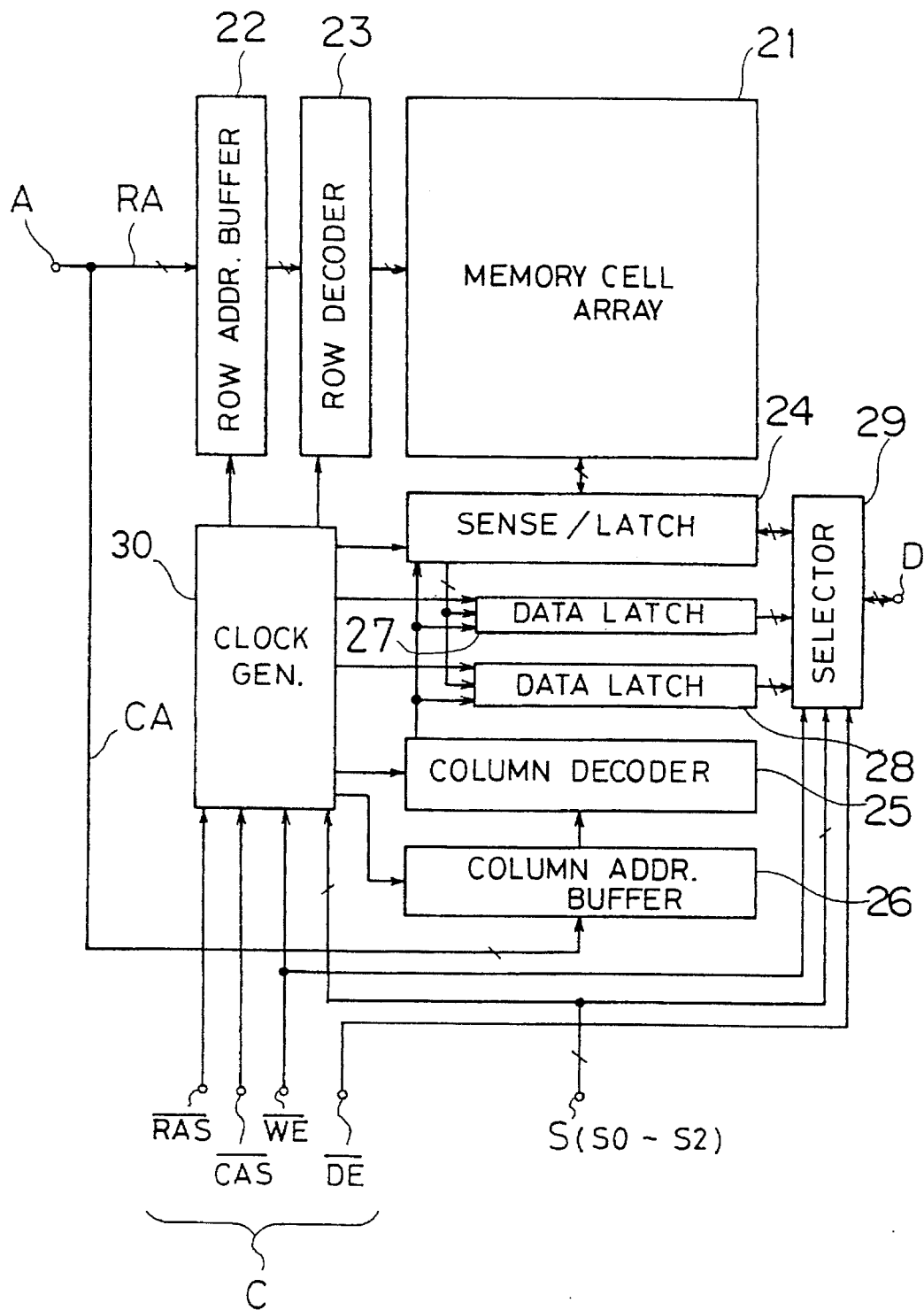
FIG. 1 is a block diagram of a memory device of an embodiment of the invention.

FIG. 1 is a block diagram of a memory device of an embodiment of the invention. In addition to address input terminals A, data input/output terminals D, and control input terminals C, all similar to those of the memory device of FIG. 8, the present memory device has three latch selection signal input terminals S for signals S0, S1, and S2. A memory cell array 21, a row address buffer 22, a row decoder 24, a sense and latch circuit 24, a column decoder 25, and a column address buffer 26 have the same function as those of FIG. 8 denoted by the reference numerals 1, 2, 3, 4, 5, and 6, respectively. Reference numerals 27 and 28 represent first and second data latch circuits, each connected in parallel with respect to the sense and latch circuit 24 to individually store row data for one page read into the sense and latch circuit 24 from the memory cell array 21. Like the sense and latch circuit 24, the column decoder 25 selects an item of data from the row data of each of the first and second data latch circuits 27 and 28. Reference numeral 29 denotes a data selector circuit to amplify, under control of a WE signal, an OE signal, and the first through third latch selection signals S0 through S2, an item of data selected by the column decoder 25 from any one of the sense and latch circuit 24, the first data latch circuit 27, and the second data latch circuit 28, and then to output the data thus amplified to the data input/output terminals D as reading data. Alternatively, the data selector circuit 28 receives data through the data input/output terminals D as writing data, to the sense and latch circuit 24. Reference numeral 30 represents a clock generator which receives the externally applied RAS signal, CAS signal, WE signal, and first, second, and third latch selection signals S0–S2. Clock generator 30 generates the various timing signals necessary for reading and writing operations in order to drive the row address buffer 22, the row decoder 23, the sense and latch circuit 24, the column decoder 25, the column address buffer 26, and the first and second data latch circuits 27 and 28, respectively.

In the memory device of the present embodiment having the foregoing configuration, the first, second, and third latch selection signals S0, S1, and S2 are signals used for designating the sense and latch circuit 24, the first data latch circuit 27, or the second data latch circuit 28 at the time data is read from the memory device (i.e., when WE is high). In other words, the first latch selection signal S0 designates the sense and latch circuit 24, the second latch selection signal S1 designates the first data latch circuit 27, and the third latch selection signal S2 designates the second data latch circuit 28. However, when data is written to the memory (i.e., when WE is low) all the designations made by the first, second, and third latch selection signals S0, S1, and S2 are invalidated so that data in the sense and latch circuit 24 is written to the memory cell array 21.

Figure 8:
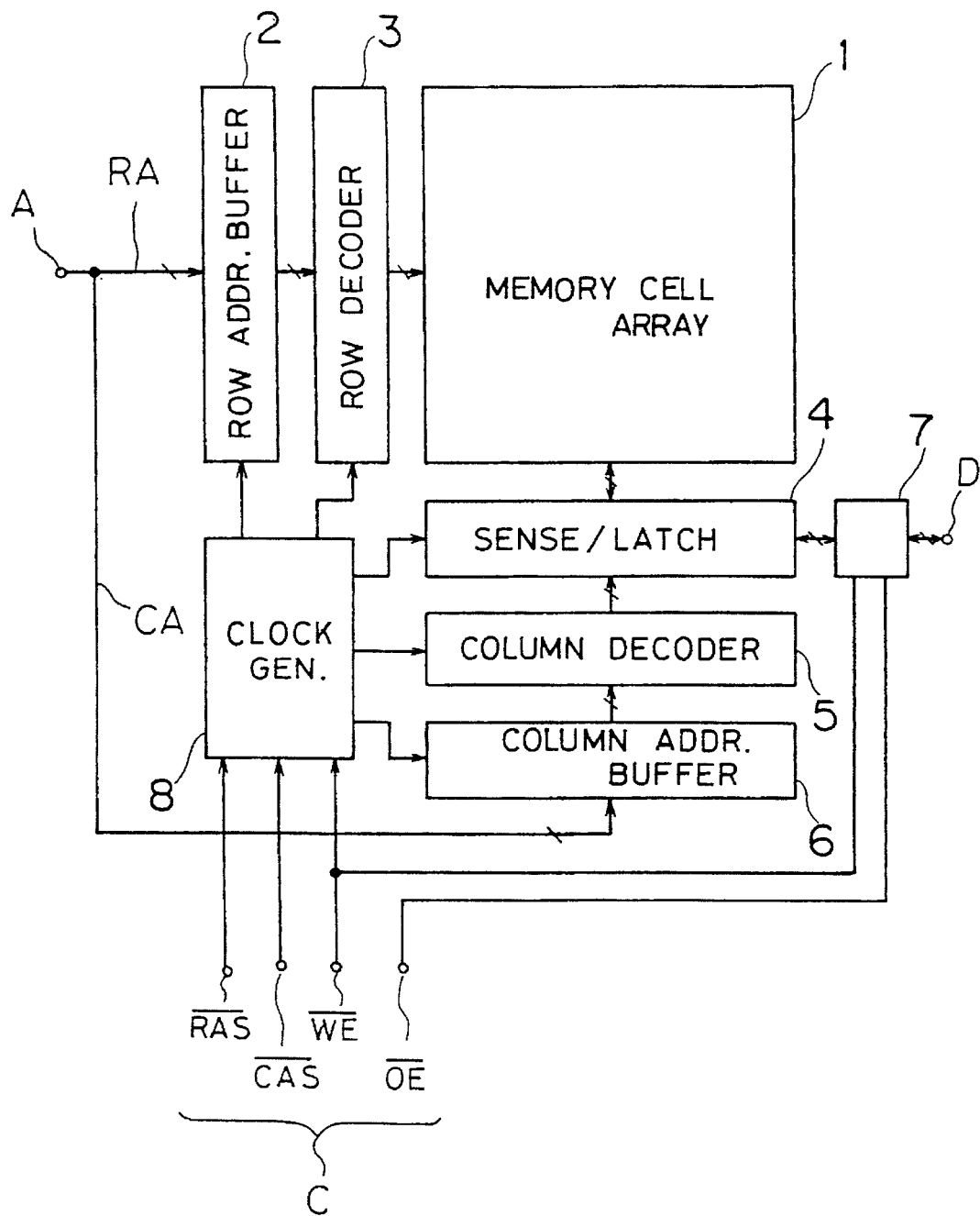
FIG. 8 is a block diagram of a conventional memory device.

If the reading of data is requested by a WE signal at high level with the sense and latch circuit 24 selected by the first latch selection signal S0, like the memory device of FIG. 8, a long cycle operation or a short cycle operation is carried out using the sense and latch circuit 24.

In contrast, if a row address RA is given together with a RAS signal when the first latch circuit 27 is selected by the second latch selection signal S1 and the reading of data is requested by a WE signal at high level, row data for one page from the memory cell array 21 is latched in the sense and latch circuit 24 and at the same time the same row data is latched also in the first data latch circuit 27. Thereafter, if a column address CA is given together with a CAS signal, an item of data, selected from among the row data for one page latched in the first data latch circuit 27, is read, and the data thus read is output through the data selector circuit 29. According to the above long cycle operation, the row data for one page is prepared in the first data latch circuit 27. Accordingly, within the range of address for one page with the same row address RA, intended data may be read with a short cycle operation which omits giving a row address RA, using the row data in the first data latch circuit 27.

Further, if the second data latch circuit 28 is selected by the third latch selection signal S2, it is possible to perform a short cycle operation by using the second data latch circuits 28. In addition to this, by allotting the two data latch circuits 27 and 28 to respective processors, it is possible to realize a short cycle operation even if both data processors alternately access different pages of the memory device. This will be explained with reference to FIGS. 2 and 3.

Figure 2:
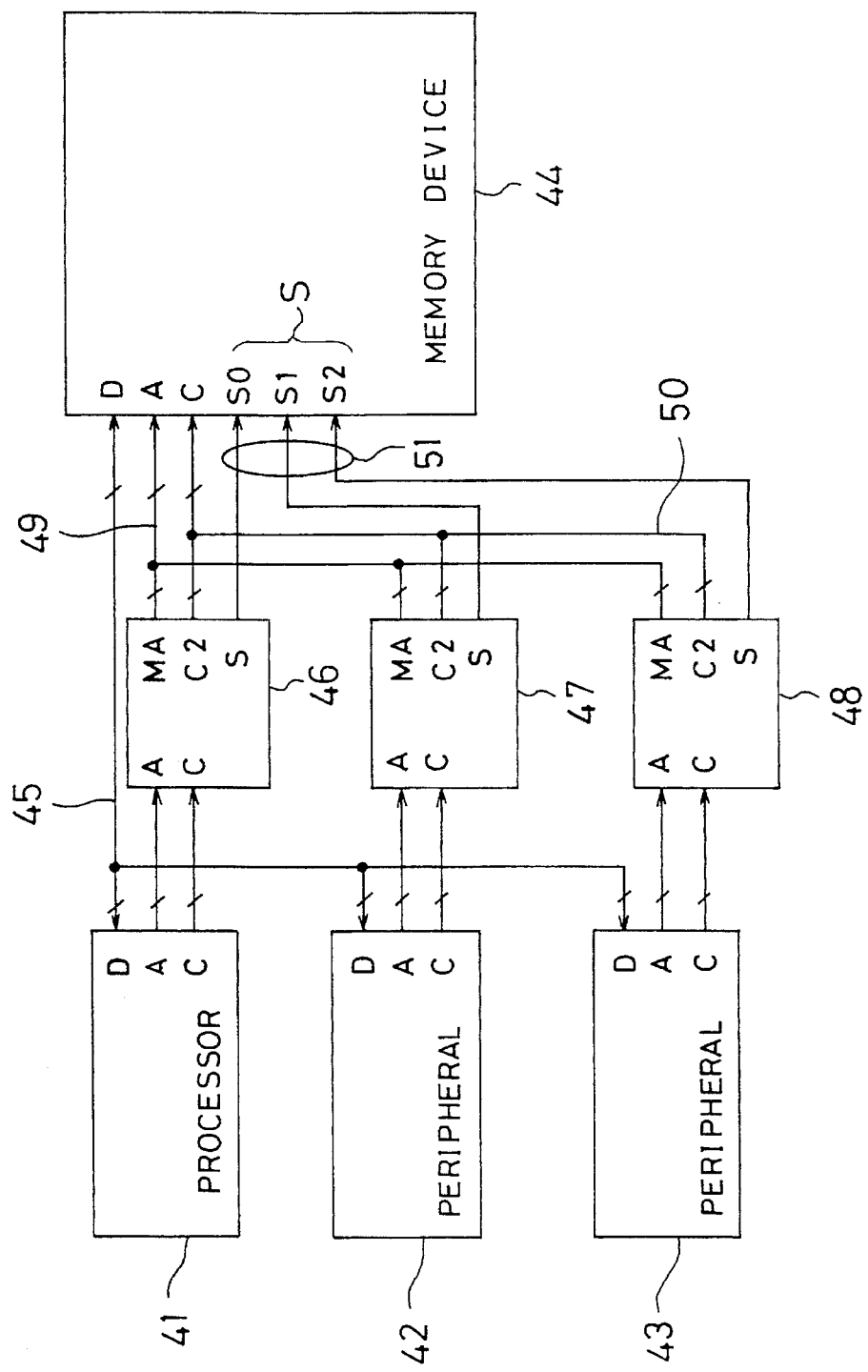
FIG. 2 is a block diagram of a data processing system of an embodiment of the invention using the memory device of FIG. 1.

FIG. 2 is a block diagram of a data processing system of an embodiment of the invention using the memory device of FIG. 1. In FIG. 2, a processing unit 41 and such first and second peripheral units 42 and 43 as DMA controllers individually access a memory device 44 having a configuration as shown in FIG. 1. Data lines of the processing unit 41, the first peripheral unit 42, and the second peripheral unit 43 are directly connected to the data input terminals D of the memory device 44 by way of a data bus 45. Address lines A and control lines C of the processing unit 41 and the first and second peripheral units 42 and 43 are connected to each input side of first, second, and third memory controllers 46, 47, and 48, respectively. Provided between the output sides of the first, second, and third memory controllers 46, 47, and 48 and the memory device 44 are a multiplexed address bus 49 and a control bus 50. The address bus 49 is connected to the address input terminals A of the memory device 44. The control bus 50 is connected to the control input terminals C of the memory device 44.

Each of the three memory controllers 46, 47, and 48 converts addresses given from each of the processing unit 41, the first peripheral unit 42, and the second peripheral unit 43 into an address of a row address RA and a column address CA in a multiplexed manner, and also converts the logic and timing of a control signal given into one suitable for access to the memory device 44. When the first memory controller 46 accesses the memory device 44, the first latch selection signal S0 is output from the first memory controller 46. When the second memory controller 47 accesses the memory device 44, the second latch selection signal S1 is output from the second memory controller 47. When the third memory controller 48 accesses the memory device 44, the third latch selection signal S2 is output from the third memory controller 48. A latch selection signal line 51 used to transfer these three latch selection signals S0, S1, and S2 is connected to latch selection signal input terminals S of the memory device 44. Each of the memory controllers 46, 47, and 48 stores the last row address given to the memory device 44 by way of the address bus 49, as a latest address, so that if the next row address RA to be fed to the memory device 44 is different from the latest address, the memory device 44 is accessed by as long cycle operation containing a row address RA and then a column address CA. On the other hand, if the next row address RA to be fed to the memory device 44 corresponds to the latest address, a short cycle operation to continuously feed column addresses CA to the memory device 44 is selected. The choice between a long or short cycle operation is based on the particular processors access history, regardless of the operation mode selected by the other two processors. In order to arbitrate the bus mastership to the data bus 45, the address bus 49, and the control bus 50 all jointly shared by processing unit 41 and first and second peripheral units 42 and 43, a bus arbiter (not shown) is necessary.

Figure 3:
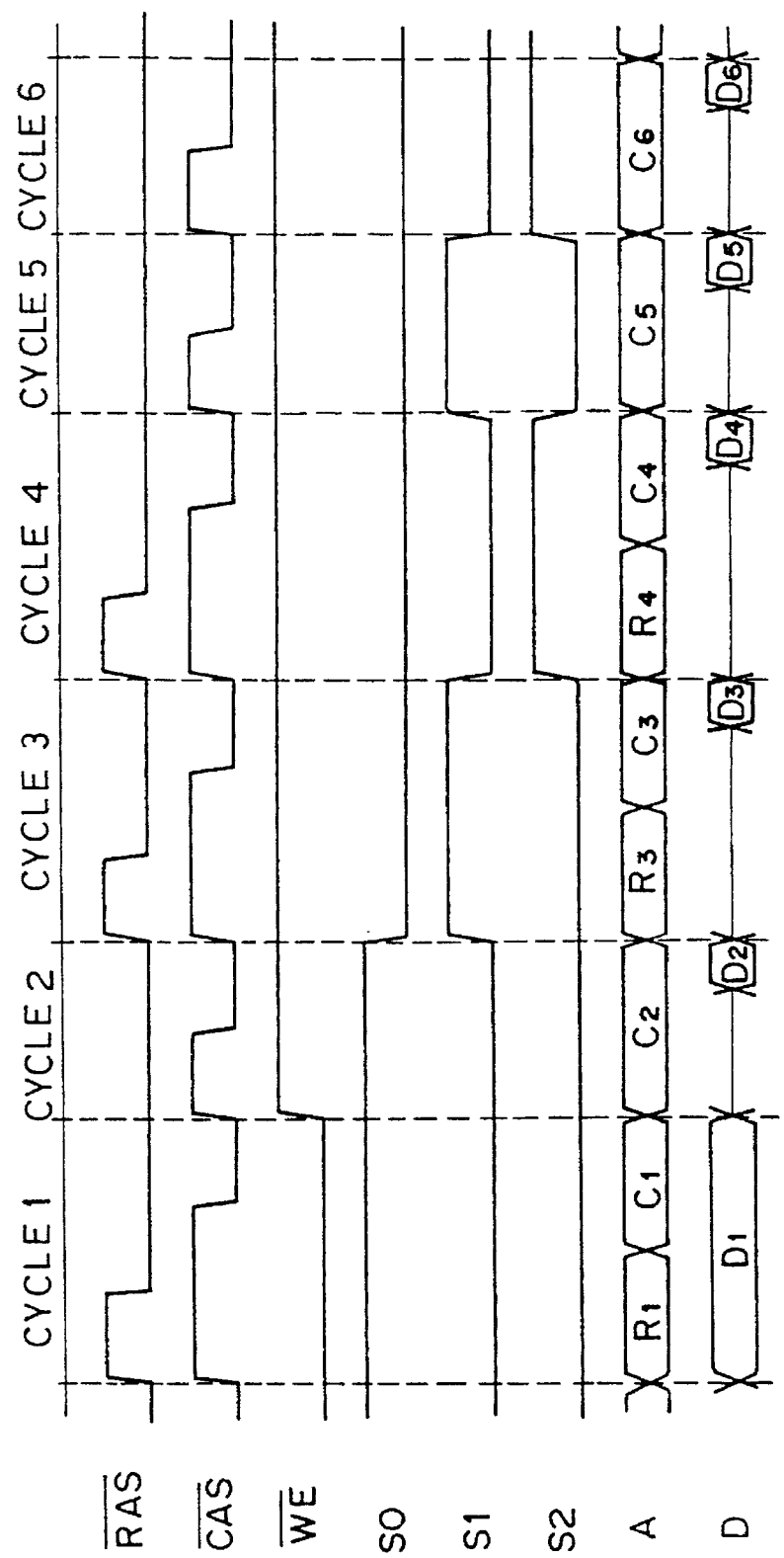
FIG. 3 is a waveform diagram showing operations of the data processing system of the FIG. 2.

FIG. 3 is a waveform diagram showing operations of the data processing system of FIG. 2, and illustrating the waveform of input and output signals to and from the memory device 44. Rn and Cn in the address input terminals waveform represents a row address RA and a column address CA, respectively. With respect to the memory device 44, in a first cycle a writing operation is executed by the processing unit 41, in a second cycle a reading operation is executed by the processing unit 41, in a third cycle a reading operation is executed by the first peripheral unit 42, in a fourth cycle a reading operation is executed by the second peripheral unit 43, in the fifth cycle a reading operation is executed by the first peripheral unit 42, and finally in a sixth cycle a reading operation is executed by the second peripheral unit 43. In the first and second cycles, the same page is accessed, and the same may apply to the third and fifth cycles, and the fourth and sixth cycles.

In the first cycle, data is written to the sense and latch circuit 24. In the second cycle, the sense and latch circuit 24 is selected by the first latch selection signal S0 from the first memory controller 46 so that a short cycle reading operation is executed. In the third cycle, the first data latch circuit 27 is selected by the second latch selection signal S1 from the second memory controller 47. After row data at a row address R3, which is read from the memory cell array 21 at the fall of a RAS signal, is transferred to the first data latch circuit 27, data D3 at a column address C3 is fed to the first peripheral unit 42, at the fall of a CAS signal. At this time, the second memory controller 47 stores the row address R3 as a latest address. In the fourth cycle, the second data latch circuit 28 is selected by the third latch selection signal S2 from the third memory controller 48. After a row data at a row address R4, which is read from the memory cell array 21 at the fall of a RAS signal, is transferred to the second data latch circuit 28, data D4 at an column address C4 is fed to the second peripheral unit 43, at the fall of a CAS signal. At this time, the third memory controller 48 stores the row address R4 as a latest address.

In the fifth cycle, the second memory controller 47 compares an upper address of the address fed from the first peripheral unit 42 with its self-stored latest address (in this instance, the row address R3), confirms that both addresses are an access to the same page, and then feeds a column address C5 omitting the row address R3. On the other hand, in the memory device 44, the first data latch circuit 27 is selected by the second latch selection signal S1 from the second memory controller 47, and data D5 at a column address C5 is fed from the first data latch circuit 27 to the first peripheral unit 42, at the fall of a CAS signal. At this time, a RAS signal to be fed to the memory device 44 is still kept at low level.

In the sixth cycle, the third memory controller 48 compares an upper address of the address fed from the second peripheral unit 43 with its self-stored latest address (in this instance, the row address R4), confirms that both addresses are an access to the same page, and feeds a column address C6 omitting the row address R4. On the other hand, in the memory device 44, the second latch circuit 28 is selected by the third latch selection signal S2 from the third memory controller 48, and data D6 at a column address C6 is fed from the second data latch circuit 28 to the second peripheral unit 43, at the fall of a CAS signal. Also, at this time, a RAS signal that is to be fed to the memory device 44 is still kept at low level.

According to the above-described embodiment, even if the first and second peripheral units 42 and 43 alternately access different pages of the memory device 44, a short cycle operation is possible, as shown and exemplified in the fifth and sixth cycles. Thus, the frequency of long cycle operation can be reduced comparatively, and in addition thereto, power consumption is decreased. Further, the sharing time for the buses 45, 49, and 50 is shortened so that bus traffic is relieved. Generally, each of data processors, namely the processing unit 41 and the first and second peripheral units 42 and 43 access the memory device 44, with considerable locality. Therefore, the foregoing advantages are considerably beneficial.

Figure 4:
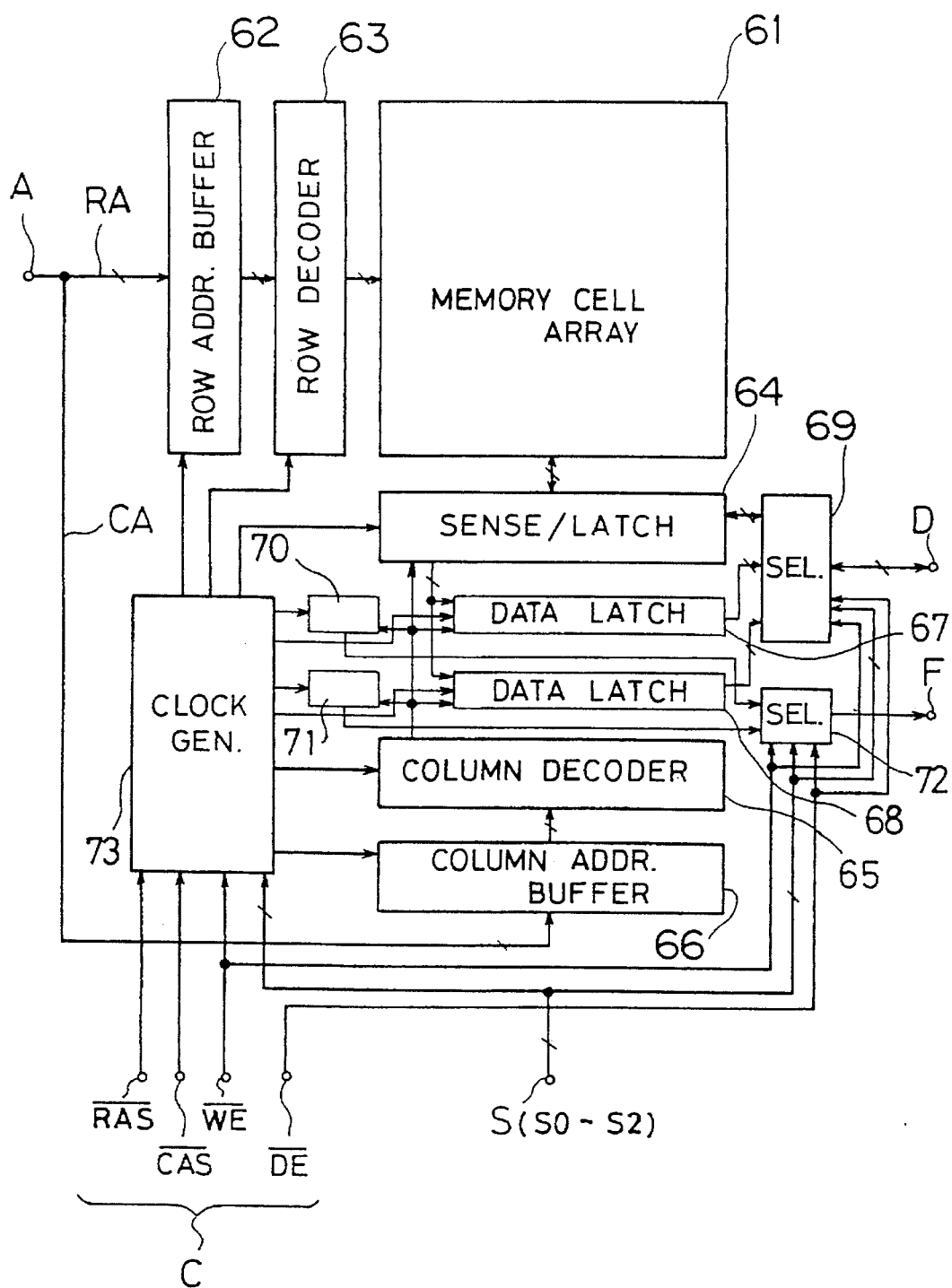
FIG. 4 is a block diagram of a memory device of another embodiment of the invention

FIG. 4 is a block diagram of a memory device of another embodiment of the invention. This memory device further includes a flag output terminal F, and address input terminals A, data input/output terminals D, control input terminals C, and latch selection signal input terminals S all similar to those in the memory device as shown in FIG. 1. It should be understood that memory cell array 61, row address buffer 62, row decoder 63, sense and latch circuit 64, column decoder 65, column address buffer 66, first and second data latch circuits 67 and 68, and data selector circuit 69 have the same function as reference numerals 21, 22, 23, 24, 25, 26, 27, 28, and 29 of FIG. 1. In order to individually store 1-bit of information as a flag, first and second flip-flop circuits denoted by reference numerals 70 and 71 correspond to the first and second data latch circuits 67 and 68, respectively. Like data selector circuit 69, flag selector circuit 72 is a circuit for selectively producing at the flag output terminal F a flag of either the first flip-flop circuit 70 or the second flip-flop circuit 73 under control of a WE signal, an OE signal, and the first, second, and the third latch selection signals S0, S1, and S2. Reference numeral 73 represents a clock generator for generating, from WE signals, OE signals, and first, second, and third latch selection signals S0, S1, and S2, various timing signals necessary for reading and writing operations in order to drive the row address buffer 62, the row decoder 63, the sense and latch circuit 64, the column decoder 65, the column address buffer 66, the first and second data latch circuits 67 and 68, and the first and second flip-flop circuits 70 and 71, respectively.

Both the first and second flip-flop circuits 70 and 71 are set when data is written to the memory device, and either one of them is reset when data is transferred from the memory cell array 61 to the corresponding data latch circuit 67 or 68, or a long cycle reading operation is executed. Like the output of data from the corresponding data latch circuit 67 and 68, a flag of each of the flip-flop circuits 70 and 71 is selected by the flag selector circuit 72, and then is output to at flag output terminal F. A flag set indicates the possibility that the contents of the corresponding data latch circuit 67 or 68 does not correspond to the data in the memory cell array 61. Accordingly, the data processor that accesses the memory device of the invention refers to the flag output through the flag output terminal F, and if the latest data is required, it selects a long cycle reading operation even when such an access relates to the same page stored in one of the data latch circuits. By executing a long cycle reading operation, it is possible to match the data in the memory cell array 61 with that of the corresponding data latch circuit 67 or 68. Also, in this embodiment, shorter access time, lighter bus traffic, and less power consumption are realized.

Figure 5:
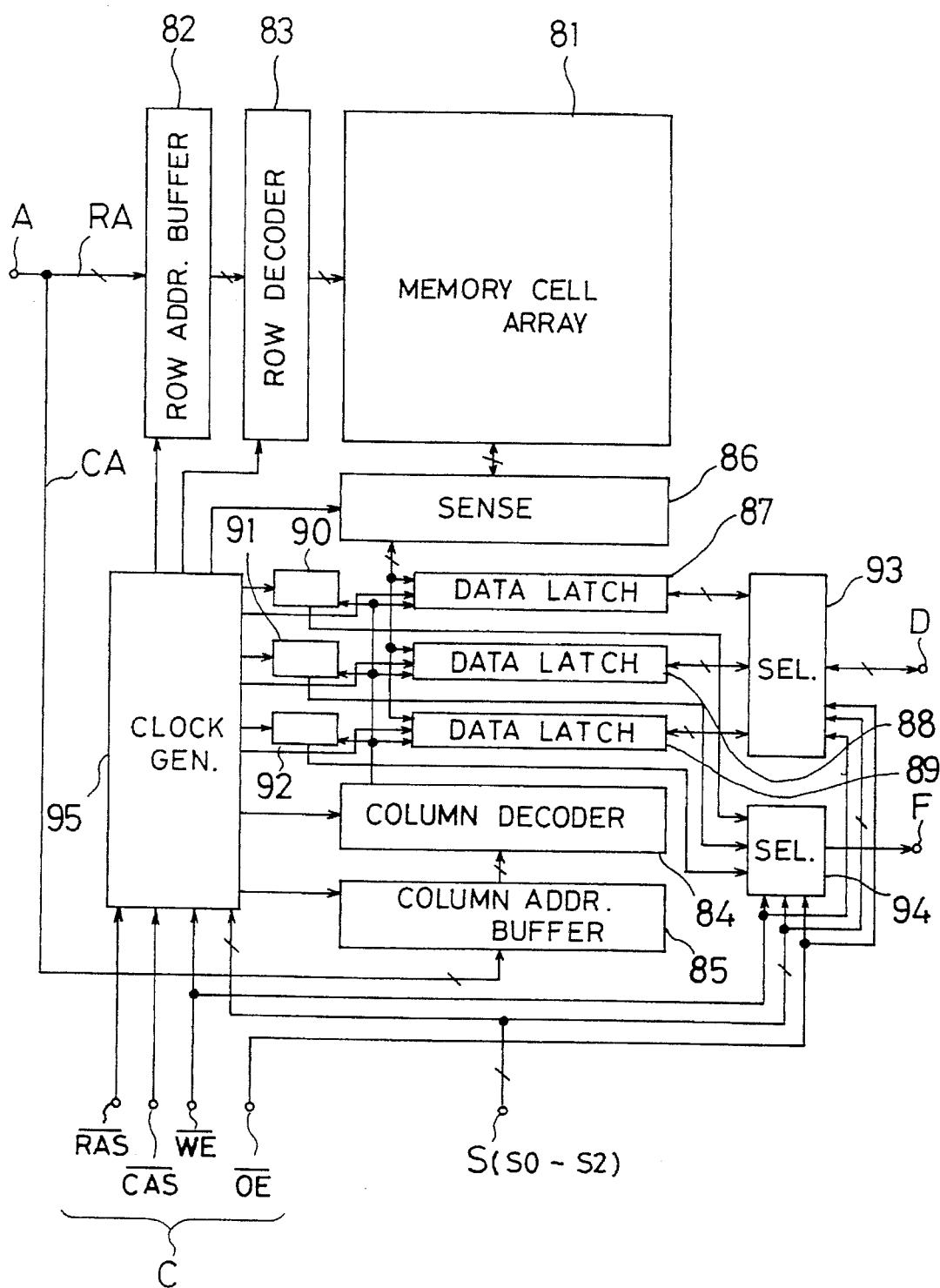
FIG. 5 is a block diagram of a memory device of still another embodiment of the invention.

FIG. 5 is a block diagram of a memory device of still another embodiment of the invention. Like the memory device as shown in FIG. 4, this memory device includes address input terminal A, data input/output terminals D, control input terminals C, latch selection signal input terminals S, and a flag output terminal F. A memory cell array 81, a row address buffer 82, a row decoder 83, a column decoder 84, and a column address buffer 85 have the same function of the elements denoted by reference numerals 61, 62, 63, 65, and 66 of FIG. 4, respectively. In this embodiment, the function of the sense and latch circuit 64 of FIG. 4 is assigned to a sense circuit 86 and a first data latch circuit 87. This embodiment further includes two other data latch circuits, second and third data latch circuits 88 and 89. These three data latch circuits 87, 88, and 89 are provided with flip-flop circuits 90, 91, and 92, respectively. A data selector circuit 93, a flag selector circuit 94, and a clock generator 95 shown in FIG. 5 correspond to the elements represented by reference numerals 69, 72, and 73 of FIG. 4, respectively.

According to this embodiment, when a long cycle reading operation is executed with either the second data latch circuit 88 or the third data latch circuit 89 designated, row data for one page read from the memory cell array 81 by the sense circuit 86 is directly transferred to the second data latch circuit 88 or the third data latch circuit 89 without passing through the first data latch circuit 87. Accordingly, even if the three data processors, which are allotted to the three data latch circuits 87, 88, and 86 respectively, alternately access different pages of the memory device, it is possible for a short cycle operation to be carried out.

Figure 6:
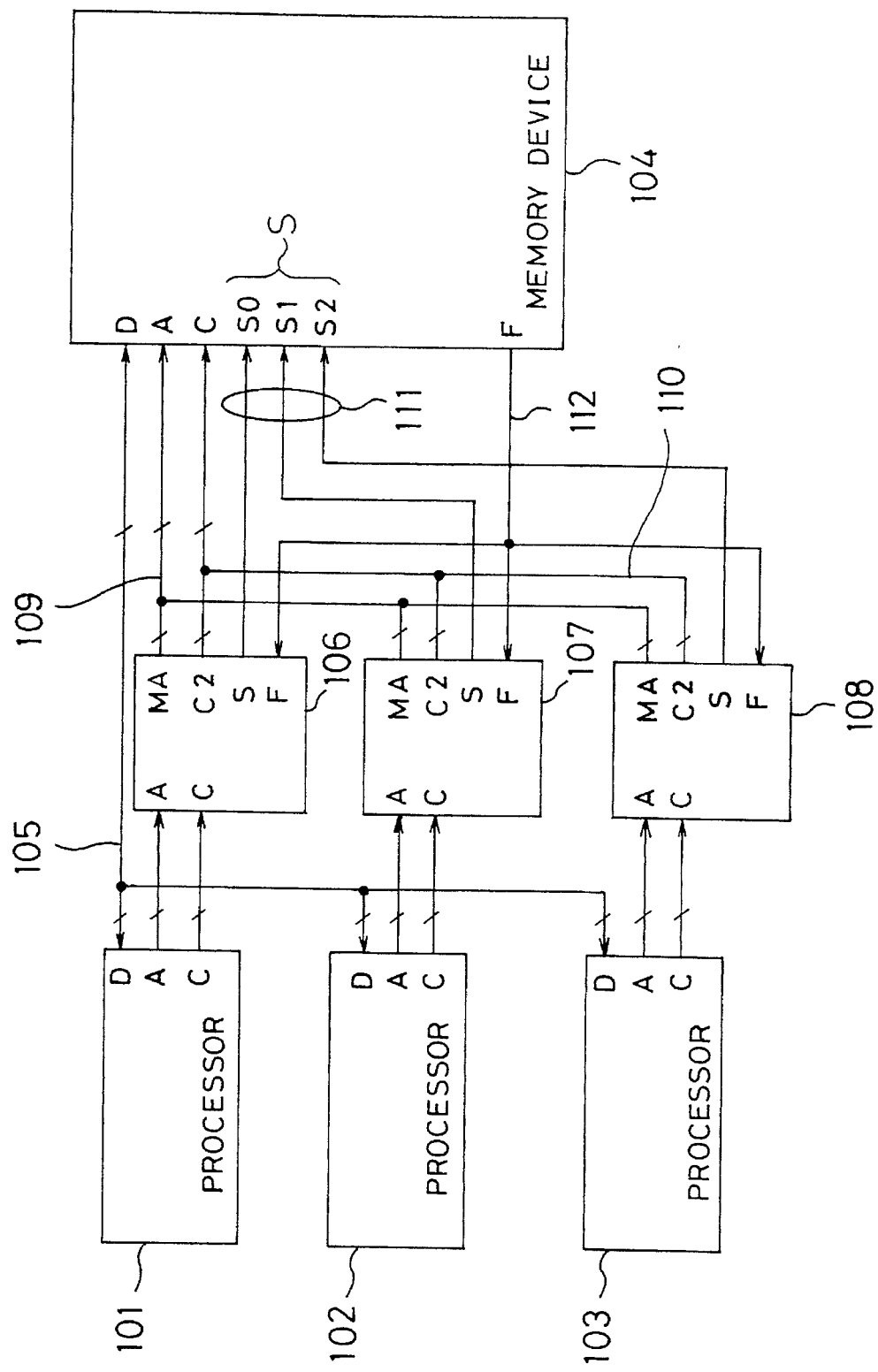
FIG. 6 is a block diagram of a data processing system of another embodiment of the invention using the memory device of FIG. 5.

FIG. 8 is a block diagram of a data processing system with a multi-processor configuration of another embodiment of the invention using the memory device of FIG. 5. In FIG. 6, three processing units 101, 102, and 103 individually access a memory device 104 having a configuration as shown in FIG. 5. Respectively arranged between the three processing units 101, 102, and 103 and the memory device 104 are memory controllers 106, 107, and 108 similarly to those shown in FIG. 2. A data bus 105, a multiplexed address bus 109, a control bus 110, and a latch selection signal line 111 have the same function as the elements denoted by reference numerals 45, 49, 50, and 51, respectively. In this embodiment, a flag line 112 is connected to a flag output terminal F on the memory device 104. The flag line 112 is in charge of feeding a flag selectively output from the flag output terminal F to the memory controllers 106, 107, and 108 respectively.

Each of the memory controllers 106, 107, and 108 stores the last row address RA fed through the address bus 109 to the memory device 104, as a latest address so that it selects a long cycle reading operation if a corresponding flag is set or if the next row address RA fed through address bus 109 is different from the latest address. Further, each of the memory controllers 106, 107, and 108 selects a short cycle reading operation if a corresponding flag is reset and the next row address RA to be fed through address bus 109 corresponds to the latest address. At this time, in the event that the three processing units 101, 102, and 103 alternately access different pages of the memory device 104, and even in the event that any two of the three processing units 101, 102, and 103 alternately access different pages of the memory device 104, a short cycle operation is possible.

Figure 7:
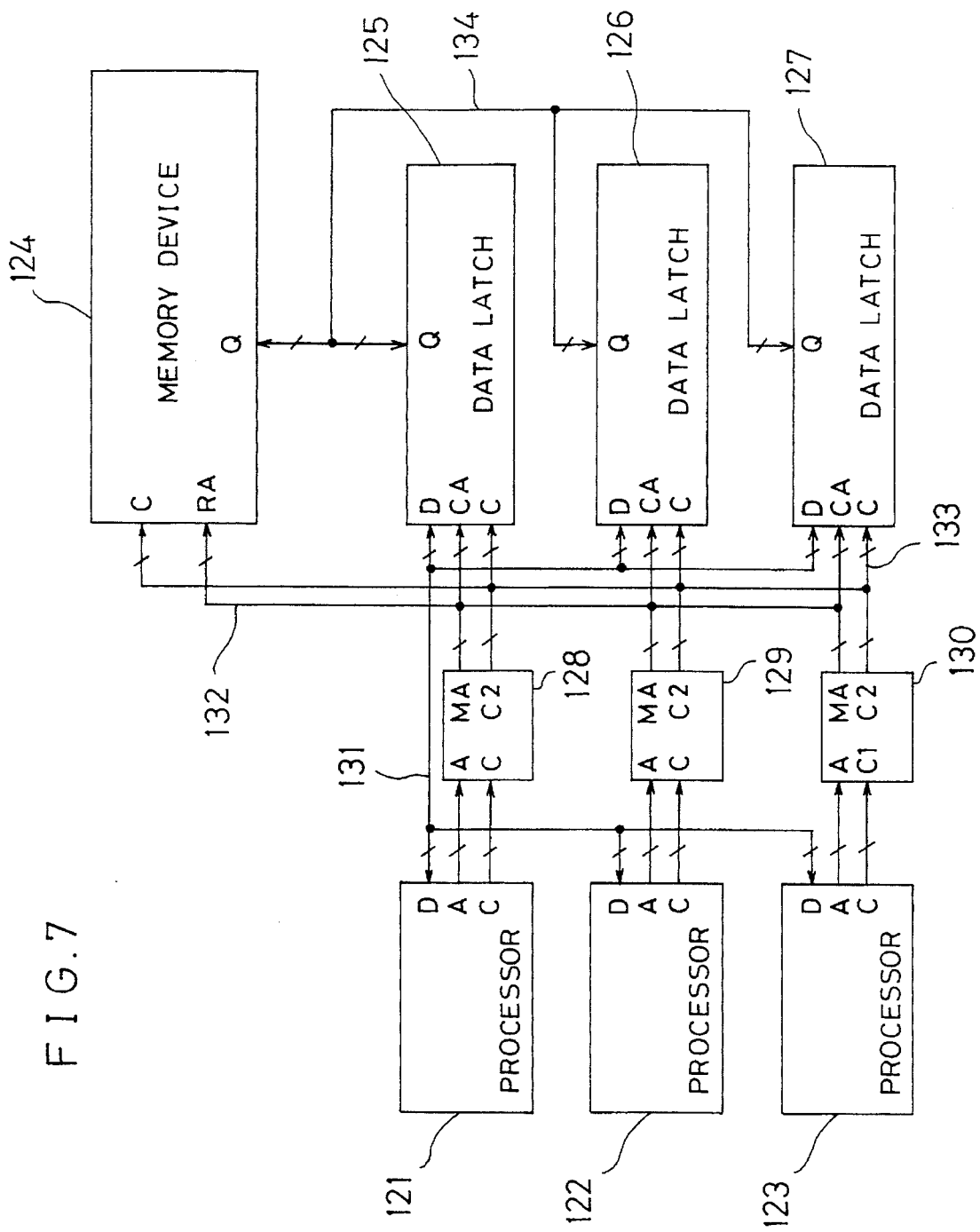
FIG. 7 is a block diagram of a data processing system of still another embodiment of the invention.

FIG. 7 is a block diagram of a data processing system with a multi-processor configuration of still another embodiment of the invention. In FIG. 7, each of processing units 121, 122, and 123 accesses a memory device 124 having a conventional configuration through which a batch reading of row data is feasible. The reference numerals 125, 126, and 127 represents three data latches external to memory device 124. Respectively arranged between the three processing units 121, 122, and 123 and their corresponding three data latches 125, 126, 127 are memory controllers 128, 129, and 130. The processing units 121, 122, and 123, and the data latches 125, 126, and 127 jointly share a data bus 131. Further, address and control lines of each of the three processing units 121, 122, and 123 are connected to each input side of the first, second, and third memory controllers 128, 129, and 130. In addition thereto, a multiplexed address bus 132 and a control bus 133 are arranged between the output sides of the first, second, and third memory controllers 128, 129, and 130, and the memory device 124 and the first, second, and third data latches 125, 126, and 127. Row data for one page read out of the memory device 124 is written through a local data bus 134 into any one of the first data latch 125, the second data latch 126, and the third data latch 127.

Each of the three memory controllers 128, 129, and 130 has such a function that it executes the conversion of address, whereby an upper address of the address fed from each of their corresponding processing units 121, 122, and 123 is converted into a row address RA while the lower address, into a column address CA. Besides, the row and column addresses are sent to the address bus 132 in a multiplexed manner, respectively. And, when the first memory controller 128 accesses the memory device 124, the first data latch 125 is selected via the control bus 133. In the same way, when the second memory controller 129 accesses the memory device 124, the second data latch 126 is selected. When the third memory controller 130 accesses the same, the third data latch 127 is selected.

Each of the memory controllers 128, 129, and 130 stores the last row address RA fed to the address bus 132, as a latest address, and if the next row address RA is different from the aforesaid latest address, it feeds a row address RA to the memory device 124 and thereafter a column address CA to its corresponding data latch. Accordingly, row data for one page in the memory device 124 is transferred to the corresponding data latch 125, 126, or 127, and then intended data is selectively output from the corresponding data latche 125, 126, or 127 to the data bus 131. In addition, if the next row address RA is the same as the latest address, a short cycle operation for continuously feeding column addresses RA to the corresponding data latch 125, 127, or 128 is selected so that an item of data is output selectively from among the row data for one page held in the corresponding data latch 125, 126, and 127. If the number of bits of row address RA is N, the data width of each of the data latches 125, 126, or 127 should be $2^N$ words.

According to the present embodiment, by placing data latches 125, 126, and 127 external to memory device 124 having a conventional configuration, the frequency of operation of the memory device 124 can be remarkably reduced, resulting in a reduction in average access time as well as a decrease in power consumption. Further, the number of address lines is reduced as compared with the case in which processing units are connected to a memory device without a multiplexed address bus. This allows the hardware to be simplified.

What I claim is:

1. A memory device which includes a memory cell array having unit memory cells arranged at respective points of intersection of rows and columns, to which row and column addresses are externally applied in a multiplexed manner in order to designate a row and column in said memory cell array, said memory device comprising:

a row data reading means for simultaneously reading, from said memory cell array data of all columns belonging to a single row designated by a row address as row data for one page;

a plurality of data latch circuits, each of said plurality of data latch circuits storing row data for one page read from said memory cell array;

a latch selection means for selecting one of said plurality of data latch circuits in response to a latch selection signal indicating which data latch to use for access to said memory cell array data, said latch selection signal externally applied; and a control means for controlling storage, in one of said plurality of data latch circuits, of row data for one page read from said memory cell array in response to a read request containing a row address, said control means further controlling reading of data corresponding to one column from said row data for one page stored in a designated data latch circuit in response to a read request containing a column address.

2. The memory device of claim 1 further comprising:

a plurality of flip-flop circuits each corresponding to one of said plurality of data latch circuits, each of said plurality of flip-flop circuits stores 1-bit of information therein as a flag indicating whether data in a corresponding data latch circuit is identical to the corresponding row data in said memory cell array; and wherein said control means:

resets a flag of one of said plurality of flip-flop circuits corresponding to said one of said plurality of data latch circuits designated by said latch selection signal if said memory device receives a read request in conjunction with a row address;

sets all flags of said plurality of flip-flop circuits if a request for writing data is externally applied to said memory device; and outputs at a flag output terminal a flag of one of said plurality of flip-flop circuits corresponding to one of said plurality of data latch circuits designated by said latch selection signal if a read request containing a column address is externally applied to said memory device.

3. A memory device which includes a memory cell array having unit memory cells arranged at respective points of intersection of rows and columns, to which row and column addresses are externally applied in a multiplexed manner in order to designate a row and column in said memory cell array, said memory device comprising:

a row address buffer for storing an externally applied row address;

a row decoder for selecting, from among the rows of said memory cell array, a single row designated by the row address stored by said row address buffer;

a sense circuit for simultaneously reading, from said memory cell array, data of all columns which belong to the row selected by said row decoder, as row data for one page, and for storing the row data thus read;

a plurality of data latch circuits, each of said plurality of data latch circuits storing row data for one page read from said memory cell array by said sense circuit in response to respective externally applied addresses;

a latch selection means for selecting a row data for one page from among said sense circuit and said plurality of data latch circuits in response to a latch selection signal, said latch selection signal externally applied;

a column address buffer for storing an externally applied column address;

a column decoder for selecting, from among the row data for one page stored by said sense circuit and said plurality of data latch circuits, an item of data corresponding to one column designated by the column address stored in said column address buffer and said latch selection means; and a clock generator for receiving externally applied signals, including, said latch selection signal, a write enable signal for selectively requesting the reading of data from said memory cell array and the writing of data through said sense circuit to said memory cell array, a row address strobe signal in conjunction with a row address, and a column address strobe signal in conjunction with a column address, said clock generator driving said row address buffer, said row decoder, said sense circuit and said data latch circuit designated by said latch selection signal, if said clock generator receives a row address strobe signal with a write enable signal and a latch selection signal, so that row data read from said memory cell array according to the row address is stored in said sense circuit and in said data latch circuit designated by said latch selection signal, and said clock generator further driving said data latch circuit designated by said latch selection signal, said column address buffer, and said column decoder to output an item of data, if said clock generator receives a column address strobe signal with a write enable signal and a latch selection signal, said item of data selected according to the column address from the row data stored in said data latch circuit designated by said latch selection signal.

4. The memory device of claim 3 further comprising:

a plurality of flip-flop circuits each corresponding to one of said plurality of data latch circuits, each of said plurality of flip-flop circuit stores 1-bit of information therein as a flag indicating whether data in each one of said plurality of data latch circuits is identical to the corresponding row data in said memory cell array; and said clock generator further having functions of:

(a) resetting a flag of one of said plurality of flip-flop circuits corresponding to one of said plurality of data latch circuits designated by said latch selection signal when said clock generator receives a row address strobe signal with a latch selection signal and a request for reading data by a write enable signal;

(b) setting all flags of said plurality of flip-flop circuits when said clock generator receives a write enable signal requesting the writing of data; and (c) outputting at a flag output terminal a flag of one of said plurality of flip-flop circuits corresponding to one of said plurality of data latch circuits designated by said latch selection signal when said clock generator receives a column address strobe signal with a latch selection signal and a request for reading data by a write enable signal.

5. A data processing system comprising:

(a) a plurality of data processors which jointly share a set of data lines, each of said data processors producing an address for reading and writing data;

(b) a memory device as claimed in claims 1 or 3 for outputting data to said data lines, a plurality of data latch circuits of said memory device corresponding to said plurality of data processors, respectively;

(c) a plurality of memory controllers corresponding to said plural data processors, respectively, jointly sharing a set of address lines together with said memory device, and feeding through said address lines to said memory device an upper part of an address given from a corresponding data processor as a row address and a lower part of the address as a column address, in a multiplexed manner; and each of said memory controllers having functions of:

(1) storing a last row address externally applied to said memory device, as a latest address, comparing the latest address with a next row address given by the corresponding data processor, and designating a corresponding data latch circuit in said memory device by producing a latch selection signal;

(2) reading from said memory device using a long cycle operation for the row address and thereafter a column address if said next row address received by said memory device is different from said latest address, and at the same time requesting reading of data with respect to said memory device, and (3) reading from said memory device using a short cycle operation to continuously give column addresses to said memory device if said next row address received by said memory device is the same as said latest address, and at the same time requesting reading of data with respect to said memory device.

6. A data processing system comprising:

(a) a plurality of data processors which jointly share a set of data lines, each of said data processors producing an address for reading and writing data;

(b) a memory device as claimed in claims 2 or 4 for outputting data to said data lines, a plurality of data latch circuits and a plurality of flip-flop circuits of said memory device corresponding to said plurality of data processors, respectively;

(c) a plurality of memory controllers corresponding to said plural data processors, respectively, jointly sharing a set of address lines together with said memory device, and feeding through said address lines to said memory device an upper part of an address given from a corresponding data processor as a row address and a lower part of the address as a column address, in a multiplexed manner;

each of said memory controllers having functions of:

(1) storing a last row address externally applied to said memory device, as a latest address, comparing the latest address with a next row address given by the corresponding data processor, and designating a corresponding data latch circuit as well as a corresponding flip-flop circuit in said memory device by outputting a latch selection signal;

(2) reading from said memory device, if a flag of the corresponding flip-flop circuit is set or a next row address received by said memory device is different from said latest address, using a long cycle operation to give a row address and thereafter a column address to said memory device while at the same time requesting the reading of data with respect to said memory device, and (3) reading from said memory device, if a flag of the corresponding flip-flop circuit is reset and a next row address received by said memory device is the same as said latest address, using a short cycle operation to continuously give column addresses to said memory device while at the same time requesting the reading of data with respect to said memory device.

7. A data processing system comprising:

(a) a plurality of data processors which jointly share a set of data lines, each of said data processors producing an address for reading and writing data;

(b) a memory device having unit memory cells arranged at respective points of intersection of rows and columns, from which data of all columns belonging to a single row that is designated by a row address is read simultaneously as a row data for one page;

(c) a plurality of data latches corresponding to said plural data processors, respectively, said plurality of data latches sharing jointly the data lines together with said plural data processors, each of said plurality of data latches storing the row data for one page read from said memory device, and said plurality of data latches further producing to said data lines, an item of data corresponding to one column designated by a column address selected from among the respectively stored row data for one page; and (d) a plurality of memory controllers corresponding to said plural data processors, respectively, jointly sharing a set of address lines together with said memory device and said plural data latches, and feeding through said address lines to said memory device and said plural data latches an upper part of an address received from a corresponding data processor as a row address and a lower part of the address as a column address, in a multiplexed manner;

each of said memory controllers having functions of:

(1) storing a last row address received by said memory device as a latest address, comparing the latest address with a next row address received from the corresponding data processor, and designating one corresponding data latch of said plural data latches which contains row data for one page corresponding to said next row address;

(2) reading from said memory device, if a next row address to be given to said memory device is different from said latest address, using a long cycle operation to give the row address to said memory device and thereafter a column address to a designated data latch in order that an item of data in said memory device is selectively output through said designated data latch to said data lines, and (3) reading from said memory device, if a next row address to be given to said memory device is the same as said latest address, using a short cycle operation to continuously give column addresses to said designated data latch in order that an item of data is selectively output to said data lines from among the row data for one page held in said designated data latch.

* * * * *

UNITED STATES PATENT AND TRADEMARK OFFICE
CERTIFICATE OF CORRECTION

PATENT NO. : 5,530,955
DATED : June 25, 1996
INVENTOR(S) : Katsuyuki Kaneko

It is certified that error appears in the above-identified patent and that said Letters Patent is hereby corrected as shown below:

Title Page, title should read -- PAGE MODE MEMORY DEVICE CAPABLE OF SHORT CYCLE ACCESS OF DIFFERENT PAGES BY A PLURALITY OF DATA PROCESSORS --.

Column 1, Line 1: "PAGE MEMORY DEVICE CAPABLE OF" should read -- PAGE MODE MEMORY DEVICE CAPABLE OF --.

Column 11, Line 50: "73" should read -- 71 --.

Signed and Sealed this

Twenty-ninth Day of December, 1998

BRUCE LEHMAN

*Attest:*

*Attesting Officer*

Commissioner of Patents and Trademarks